United States Patent
Suzuki et al.

(10) Patent No.: US 9,640,404 B2
(45) Date of Patent: May 2, 2017

(54) METHOD OF FORMING TUNGSTEN FILM

(71) Applicant: Tokyo Electron Limited, Tokyo (JP)

(72) Inventors: Kenji Suzuki, Yamanashi (JP); Koji Maekawa, Yamanashi (JP); Takanobu Hotta, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/080,281

(22) Filed: Mar. 24, 2016

(65) Prior Publication Data

US 2016/0284553 A1 Sep. 29, 2016

(30) Foreign Application Priority Data

Mar. 27, 2015 (JP) .................................. 2015-65662

(51) Int. Cl.
*H01L 21/768* (2006.01)
*H01L 21/285* (2006.01)
(Continued)

(52) U.S. Cl.
CPC ........ *H01L 21/28556* (2013.01); *C23C 16/08* (2013.01); *C23C 16/455* (2013.01);
(Continued)

(58) Field of Classification Search
CPC ......... H01L 21/28556; H01L 21/28568; H01L 21/76841; H01L 21/76883; H01L 21/76879; C23C 16/46; C23C 16/08
See application file for complete search history.

(56) References Cited

U.S. PATENT DOCUMENTS 7,772,114 B2 * 8/2010 Chan ................... C23C 16/02
257/E21.168
8,975,184 B2 * 3/2015 Chen ................... C23C 16/0245
257/E21.171
(Continued)

FOREIGN PATENT DOCUMENTS

| JP | 2003-193233 | 7/2003 |
| JP | 2004-273764 | 9/2004 |
| JP | 2006-028572 | 2/2006 |

OTHER PUBLICATIONS

J.A.M. Ammerlean et al., "Chemical vapour deposition of tungsten by $H_2$ reduction of $WCl_6$", Applied Surface Science 53 (1991), pp. 24-29.

*Primary Examiner* — Savitr Mulpuri

(57) ABSTRACT

In a method of forming a tungsten film, an initial tungsten film and a main tungsten film are formed on an underlying film of a substrate. The initial tungsten film is formed on the underlying film by sequentially supplying a tungsten chloride gas and a reduction gas into a chamber while supplying a purging gas between the supplies of the tungsten chloride gas and the reduction gas, or by simultaneously supplying the tungsten chloride gas and the reduction gas. The main tungsten film is formed on the initial tungsten film by sequentially supplying the tungsten chloride gas and the reduction gas into the chamber while purging an inside of the chamber between the supplies of the tungsten chloride gas and the reduction gas. A supply amount of the tungsten chloride gas in forming the initial film is smaller than that in forming the main tungsten film.

13 Claims, 10 Drawing Sheets

(51) Int. Cl.
    *C23C 16/46*         (2006.01)
    *C23C 16/08*         (2006.01)
    *C23C 16/455*      (2006.01)

(52) U.S. Cl.
    CPC ........ *C23C 16/46* (2013.01); *H01L 21/28568* (2013.01); *H01L 21/76841* (2013.01); *H01L 21/76879* (2013.01); *H01L 21/76883* (2013.01)

(56) References Cited

U.S. PATENT DOCUMENTS

| | | | | |
|---|---|---|---|---|
| 2001/0007797 | A1* | 7/2001 | Jang | C23C 16/0272 |
| | | | | 438/761 |
| 2005/0032364 | A1* | 2/2005 | Okubo | C23C 16/0281 |
| | | | | 438/680 |
| 2009/0045517 | A1* | 2/2009 | Sugiura | C23C 16/14 |
| | | | | 257/770 |
| 2009/0149022 | A1* | 6/2009 | Chan | C23C 16/02 |
| | | | | 438/660 |
| 2009/0163025 | A1* | 6/2009 | Humayun | C23C 16/30 |
| | | | | 438/675 |
| 2009/0246373 | A1* | 10/2009 | Tachibana | C23C 16/14 |
| | | | | 427/255.23 |
| 2010/0055904 | A1* | 3/2010 | Chen | C23C 16/0281 |
| | | | | 438/680 |
| 2010/0159694 | A1* | 6/2010 | Chandrashekar | C23C 16/0281 |
| | | | | 438/660 |
| 2014/0120723 | A1* | 5/2014 | Fu | H01L 21/28506 |
| | | | | 438/680 |
| 2015/0279735 | A1* | 10/2015 | Hotta | H01L 21/28556 |
| | | | | 438/656 |
| 2015/0325475 | A1* | 11/2015 | Bamnolker | C23C 16/045 |
| | | | | 438/680 |

\* cited by examiner

REPEAT PREDETERMINED CYCLES

FIG.10

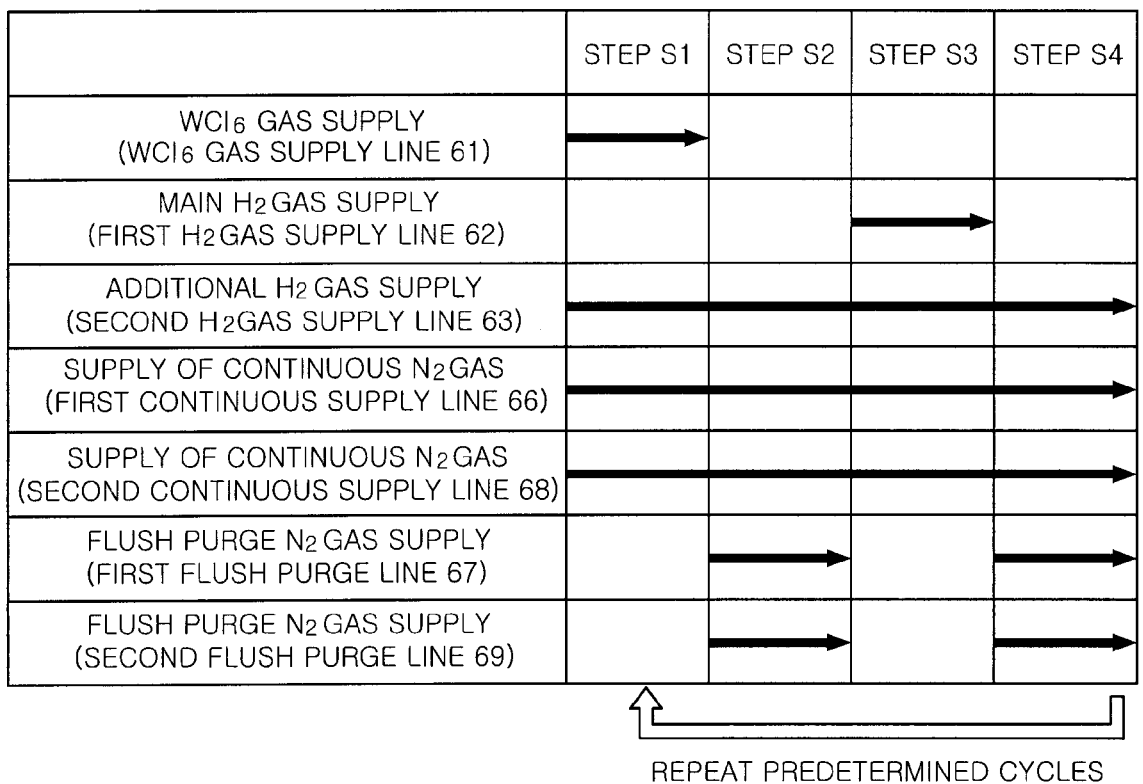

|  | STEP S1 | STEP S2 | STEP S3 | STEP S4 |
|---|---|---|---|---|
| WCl6 GAS SUPPLY (WCl6 GAS SUPPLY LINE 61) | → | | | |
| MAIN H2 GAS SUPPLY (FIRST H2 GAS SUPPLY LINE 62) | | | → | |
| ADDITIONAL H2 GAS SUPPLY (SECOND H2 GAS SUPPLY LINE 63) | →→→→→→→→→→→→→→→→ | | | |
| SUPPLY OF CONTINUOUS N2 GAS (FIRST CONTINUOUS SUPPLY LINE 66) | →→→→→→→→→→→→→→→→ | | | |
| SUPPLY OF CONTINUOUS N2 GAS (SECOND CONTINUOUS SUPPLY LINE 68) | →→→→→→→→→→→→→→→→ | | | |
| FLUSH PURGE N2 GAS SUPPLY (FIRST FLUSH PURGE LINE 67) | | → | | → |
| FLUSH PURGE N2 GAS SUPPLY (SECOND FLUSH PURGE LINE 69) | | → | | → |

REPEAT PREDETERMINED CYCLES

METHOD OF FORMING TUNGSTEN FILM

CROSS-REFERENCE TO RELATED APPLICATIONS

This application claims priority to Japanese Patent Application No. 2015-065662 filed on Mar. 27, 2015, the entire contents of which are incorporated herein by reference.

FIELD OF THE INVENTION

The disclosure relates to a method of forming a tungsten film.

BACKGROUND OF THE INVENTION

In manufacturing an LSI (large-scale integration), tungsten is widely used for a MOSFET gate electrode, a contact with source/drain, a word line of a memory, or the like. In a multilayer interconnection process, a copper wiring is mainly used. However, copper is easily diffused and has insufficient heat resistance. Therefore, tungsten is used for a portion where heat resistance is required or a portion where electrical characteristics may deteriorate due to diffusion of copper.

A physical vapor deposition (PVD) method has been conventionally used for a tungsten film forming process. However, it is difficult in the PVD method to deal with a portion where a high step coverage is required. Therefore, a chemical vapor deposition (CVD) method that provides a good step coverage is used for film formation.

As a film forming method for forming a tungsten film (CVD-tungsten film) by using the CVD method, there is generally used a method in which reaction $WF_6 + 3H_2 \rightarrow W + 6HF$ occurs on a semiconductor wafer as a target object by using tungsten hexafluoride ($WF_6$) as a source gas and $H_2$ gas as a reduction gas (see, e.g., Japanese Patent Application Publication Nos. 2003-193233 and 2004-273764).

However, in the case of forming a CVD-tungsten film by using $WF_6$ gas, it is very concerned that a gate insulating film is reduced by fluorine contained in $WF_6$ to deteriorate electrical characteristics particularly at gate electrodes or word lines of a memory in a semiconductor device.

As a source gas used for formation of a CVD-W film that does not contain fluorine, tungsten hexachloride ($WCl_6$) is known (see, e.g., Japanese Patent Application Publication No. 2006-28572, and J. A. M. Ammerlaan et al., "Chemical vapor deposition of tungsten by $H_2$ reduction of $WCl_6$", Applied Surface Science 53 (1991), pp. 24-29). Although chlorine also has reducibility like fluorine, the reducibility of chlorine is weaker than that of fluorine. Thus, it is expected that an adverse effect of chlorine on the electrical characteristics would be small.

Recently, as a semiconductor device is further miniaturized, it becomes difficult to fill a pattern having a complicated shape even by using the CVD method that can provide a good step coverage. In view of obtaining a higher step coverage, an atomic layer deposition (ALD) method, in which a source gas and a reduction gas are sequentially supplied with a purge process interposed therebetween, attracts attention.

However, in the case of forming a tungsten film by CVD or ALD, since the tungsten film has a poor adhesive strength to an oxide film such as an interlayer insulating film and requires a long incubation time, it is difficult to form the tungsten film. For the above reason, a Ti-based material film such as a TiN film or the like is used as an underlying film, so that a tungsten film has a good adhesive strength and a good fillability.

However, due to the recent miniaturization or complication of the devices, the adhesive strength and the fillability of the tungsten film may not be sufficiently ensured even by using a TiN film or the like as an underlying film.

SUMMARY OF THE INVENTION

In view of the above, the disclosure provides a method of forming a tungsten film, which is capable of forming a tungsten film having an excellent adhesive strength and excellent fillability by an ALD method using a tungsten chloride gas as a source gas in spite of miniaturization or complication of devices.

The present inventors have examined why the miniaturization and the complication of the devices cause deterioration of the adhesive strength and the fillability of the tungsten film even if an underlying film exists. As a result, the present inventors have reached the following conclusion. A tungsten chloride gas has a property of etching a material forming the underlying film such as a TiN film or the like. The etching amount of the underlying film such as a TiN film or the like tends to be increased as a required amount of a tungsten source gas is increased due to the complication of the devices. Further, along with the trend toward the miniaturization of the devices, a thickness of the underlying film becomes smaller in view of obtaining a low resistivity of a wiring. Accordingly, a thickness of a remaining underlying film becomes smaller than that required to ensure the adhesive strength and the fillability of the tungsten film.

As a result of further examination, the present inventors have found that required thickness of the underlying film can be ensured by alleviating an etching effect on the underlying film. To do so, before a main tungsten film is formed by ALD, an initial tungsten film is formed by supplying $WCl_6$ gas having an etching effect by CVD or ALD under the condition that the amount of the supplied $WCl_6$ gas is smaller than that for the main tungsten film formation. Based on the above, the present inventors have conceived the disclosure.

In accordance with an aspect, there is provided a method of forming a tungsten film on a substrate having thereon an underlying film by using a tungsten chloride gas as a tungsten source gas and a reduction gas for reducing the tungsten chloride gas. The substrate is accommodated in a chamber maintained under a depressurized atmosphere. First, an initial tungsten film is formed on the underlying film by sequentially supplying the tungsten chloride gas and the reduction gas into the chamber while supplying a purging gas into the chamber between the supply of the tungsten chloride gas and the supply of the reduction gas, or by simultaneously supplying the tungsten chloride gas and the reduction gas into the chamber. Next, a main tungsten film is formed on the initial tungsten film by sequentially supplying the tungsten chloride gas and the reduction gas into the chamber while purging an inside of the chamber between the supply of the tungsten chloride gas and the supply of the reduction gas. A supply amount of the tungsten chloride gas supplied in forming the initial film is smaller than a supply amount of the tungsten chloride gas supplied in forming the main tungsten film.

In accordance with another aspect, there is provided a computer-executable storage medium storing a program for controlling a film forming apparatus. The program, when executed, causes a computer to control the film forming apparatus to perform the method of forming a tungsten film described above.

BRIEF DESCRIPTION OF THE DRAWINGS

The objects and features of the disclosure will become apparent from the following description of embodiments, given in conjunction with the accompanying drawings, in which:

FIG. 10 shows another example of the gas supply sequence when forming the initial tungsten film and the main tungsten film.

DETAILED DESCRIPTION OF THE EMBODIMENTS

Hereinafter, embodiments will be described in detail with reference to the accompanying drawings.

<Example of Film Forming Apparatus>

Figure 1:
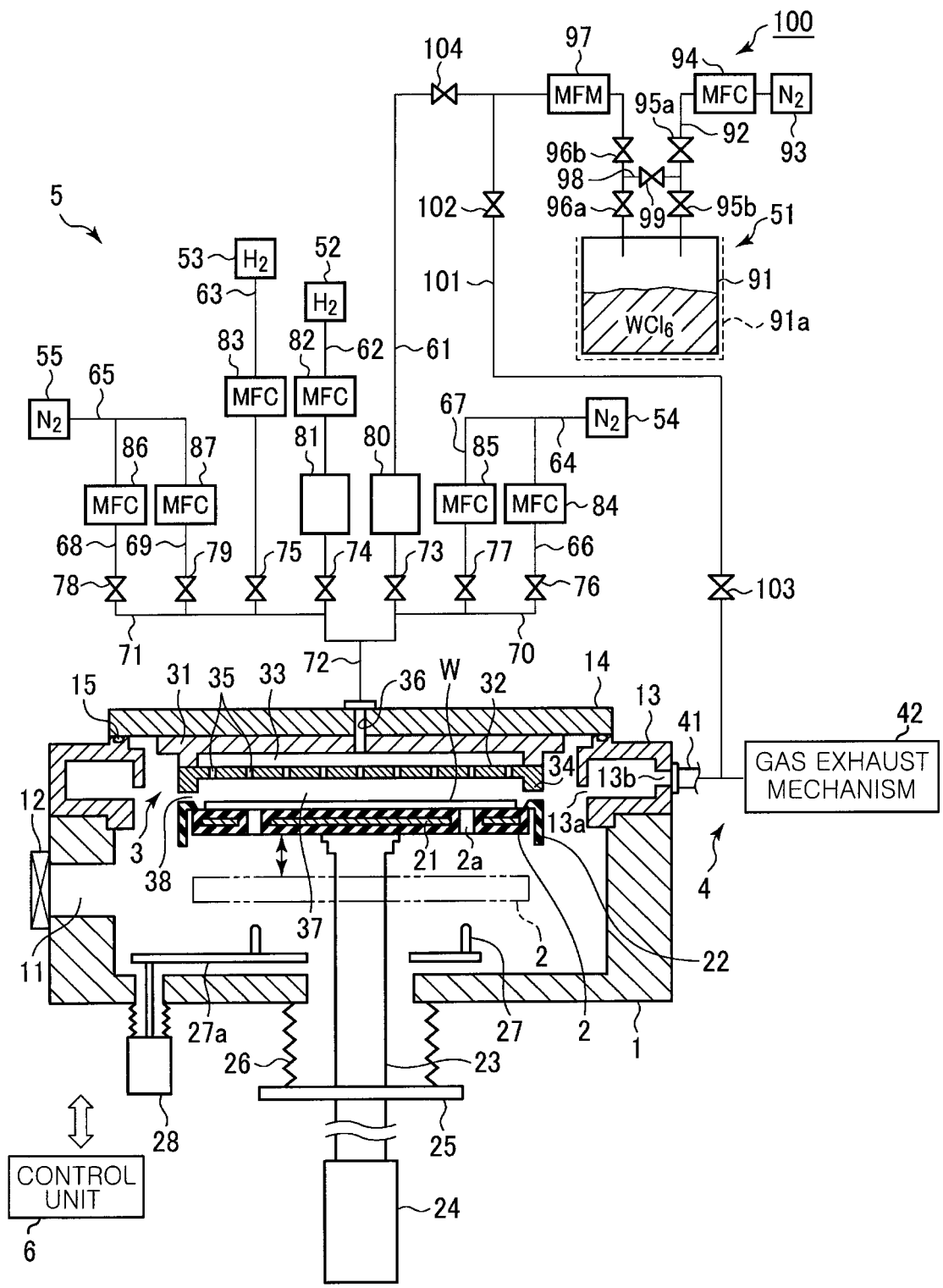
FIG. 1 is a cross sectional view showing an example of a film forming apparatus for performing a method of forming a tungsten film according to an embodiment.

FIG. 1 is a cross sectional view showing an example of a film forming apparatus for performing a method of forming a tungsten film according to an embodiment. This film forming apparatus is configured as an apparatus capable of performing both of ALD film formation and CVD film formation.

A film forming apparatus 100 includes a chamber 1, a susceptor 2 for horizontally supporting a semiconductor wafer W (hereinafter, referred to as "wafer") that is a substrate to be processed, in the chamber 1, a shower head 3 for supplying a processing gas into the chamber 1 in a shower shape, a gas exhaust unit 4 for exhausting a gas from the chamber 1, a processing gas supply mechanism 5 for supplying a processing gas into the shower head 3, and a control unit 6.

The chamber 1 is made of a metal such as aluminum or the like and has a substantially cylindrical shape. Formed at a sidewall of the chamber 1 is a loading/unloading port 11 through which the wafer W is loaded/unloaded. The loading/unloading port 12 can be opened and closed by a gate valve 12. A circular ring-shaped gas exhaust duct 13 having a rectangular cross section is provided on a main body of the chamber 1. A slit 13a is formed along an inner peripheral surface of the gas exhaust duct 13. A gas exhaust port 13b is formed at an outer wall of the gas exhaust duct 13. A ceiling wall 14 is provided on a top surface of the gas exhaust duct 13 to block an upper opening of the chamber 1. A space between the ceiling wall 14 and the gas exhaust duct 13 is airtightly sealed by a seal ring 15.

The susceptor 2 has a disc-shape of a size corresponding to the wafer W. The susceptor 2 is supported by a supporting member 23. The susceptor 2 is made of a ceramic material such as aluminum nitride (AlN) or the like, or a metal material such as aluminum, a Ni-based alloy or the like. A heater 21 for heating the wafer W is buried in the susceptor 2. The heater 21 is configured to generate heat by power supplied from a heater power supply (not shown). The wafer W can be controlled to a predetermined temperature by controlling an output of the heater 21 based on a temperature signal of a thermocouple (not shown) provided near a wafer mounting surface of a top surface of the susceptor 2.

The susceptor 2 has a covering member 22 made of ceramic such as alumina or the like. The covering member 22 covers an outer peripheral area of the wafer mounting surface and a side surface of the susceptor 2.

The supporting member 23 for supporting the susceptor 2 extends from a center of a bottom surface of the susceptor 2 to below the chamber 1 while penetrating through an opening formed at a bottom wall of the chamber 1. A lower end of the supporting member 23 is connected to an elevating mechanism 24. The susceptor 2 can be vertically moved by the elevating mechanism 24 through the supporting member 23 between a processing position shown in FIG. 1 and a transfer position where the wafer can be transferred. The transfer position is disposed below the processing position and indicated by a dashed dotted line. A collar portion 25 is attached to the supporting member 23 at below the chamber 1. A bellows 26 is provided between a bottom surface of the chamber 1 and the collar portion 25. The bellows 26 isolates an atmosphere in the chamber 1 from the exterior air, and is extended and contracted by the vertical movement of the susceptor 2.

An elevating plate 27a is provided near the bottom wall of the chamber 1 and three wafer supporting pins 27 (only two are shown) are provided to protrude upward from an elevating plate 27a. The wafer supporting pins 27 can be vertically moved along with the elevating plate 27a by an elevating mechanism 28 provided below the chamber 1. The wafer supporting pins 27 can be inserted into respective through-holes 2a formed in the susceptor 2 to protrude beyond and retreat below the top surface of the susceptor 2 when the susceptor 2 is located at the transfer position. By vertically moving the wafer supporting pins 27, the wafer W can be transferred between a wafer transfer unit (not shown) and the susceptor 2.

The shower head 3 is made of a metal. The shower head 3 is disposed to face the susceptor 2 and has substantially the same diameter as that of the susceptor 2. The shower head 3 includes a main body 31 fixed to the ceiling wall 14 of the chamber 1 and a shower plate 32 connected to the main body 31 from below. A gas diffusion space 33 is formed between the main body 31 and the shower plate. A gas inlet opening 36 is formed to penetrate through a central portion of the ceiling wall 14 of the chamber 1 and the main body 31 and communicates with the gas diffusion space 33. An annular protrusion 34 protruding downward is formed at a peripheral portion of the shower plate 32. Gas injection openings 35 are formed in a flat surface of the shower plate 32 at the inner side of the annular protrusion 34.

In a state where the susceptor 2 is located at the processing position, a processing space 37 is formed between the shower plate 32 and the susceptor 2. Further, the annular protrusion 34 and the top surface of the covering member 22 of the susceptor 2 become closer to each other so that an annular gap 38 is formed therebetween.

The gas exhaust unit 4 includes a gas exhaust line 41 which is connected to the gas exhaust port 13b of the gas exhaust duct 13, and a gas exhaust mechanism 42 which has a vacuum pump, a pressure control valve and the like and is connected to the gas exhaust line 41. During the processing, a gas in the chamber 1 reaches the gas exhaust duct 13 through the slit 13a and is exhausted from the gas exhaust duct 13 through the gas exhaust line 41 by the gas exhaust mechanism 42 of the gas exhaust unit 4.

The processing gas supply mechanism 5 includes a $WCl_6$ gas supply mechanism 51 for supplying $WCl_6$ gas that is a tungsten chloride gas as a tungsten source, a first $H_2$ gas supply source 52 for supplying $H_2$ gas as a main reduction gas, a second $H_2$ gas supply source 53 for supplying $H_2$ gas as an additional reduction gas, and a first and a second $N_2$ gas supply source 54 and 55 for supplying $N_2$ gas as a purge gas. The processing gas supply mechanism 5 further includes a $WCl_6$ gas supply line 61 extended from the $WCl_6$ gas supply mechanism 51, a first $H_2$ gas supply line 62 extended from the first $H_2$ gas supply source 52, a second $H_2$ gas supply line 63 extended from the second $H_2$ gas supply source 53, a first $N_2$ gas supply line 64 extended from the first $N_2$ gas supply source 54 and configured to supply $N_2$ gas to the $WCl_6$ gas supply line 61, and a second $N_2$ gas supply line 65 extended from the second $N_2$ gas supply source 55 and configured to supply $N_2$ gas to the first $H_2$ gas supply line 62.

The first $N_2$ gas supply line 64 is branched into a first continuous supply line 66 for continuously supplying $N_2$ gas during the film formation using the ALD method and a first flush purge line 67 for supplying $N_2$ gas only during the purge process. The second $N_2$ gas supply line 65 is branched into a second continuous supply line 68 for continuously supplying $N_2$ gas during the film formation using the ALD method, and a second flush purge line 69 for supplying $N_2$ gas only during the purge process. The first continuous supply line 66 and the first flush purge line 67 are connected to a first connection line 70. The first connection line 70 is connected to the $WCl_6$ gas supply line 61. The second $H_2$ gas supply line 63, the second continuous supply line 68, and the second flush purge line 69 are connected to a second connection line 71. The second connection line 71 is connected to the first $H_2$ gas supply line 62. The $WCl_6$ gas supply line 61 and the first $H_2$ gas supply line 62 join with a joint line 72. The joint line 72 is connected to the gas inlet opening 36.

Opening/closing valves 73 to 79 for switching gases when the ALD are provided at the most downstream sides of the $WCl_6$ gas supply line 61, the first $H_2$ gas supply line 62, the second $H_2$ gas supply line 63, the first continuous supply line 66, the first flush purge line 67, the second continuous supply line 68, and the second flush purge line 69, respectively. Further, mass flow controllers 82 to 87 serving as flow rate controllers are provided at upstream sides of the opening/closing valves of the first $H_2$ gas supply line 62, the second $H_2$ gas supply line 63, the first continuous supply line 66, the first flush purge line 67, the second continuous supply line 68, and the second flush purge line 69, respectively. Furthermore, buffer tanks 80 and 81 are respectively provided in the $WCl_6$ gas supply line 61 and the first $H_2$ gas supply line 62, so that required gases can be supplied within a short period of time.

The $WCl_6$ gas supply mechanism 51 includes a film forming material tank 91 for accommodating $WCl_6$. $WCl_6$ is in a solid state at a room temperature and solid $WCl_6$ is accommodated in the film forming material tank 91. A heater 91a is provided around the film forming material tank 91 to heat the film forming material in the tank 91 to an appropriate temperature to sublimate $WCl_6$. The aforementioned $WCl_6$ gas supply line 61 is inserted into the film forming material tank 91 from the top thereof.

The $WCl_6$ gas supply mechanism 51 includes: a carrier gas line 92 inserted into the film forming material tank 91 from the top thereof; a carrier $N_2$ gas supply source 93 for supplying $N_2$ gas as a carrier gas to the carrier gas line 92; a mass flow controller 94 connected to the carrier gas line 92 and serving as a flow rate controller; opening/closing valves 95a and 95b installed at a downstream side of the mass flow controller 94; opening/closing valves 96a and 96b provided, near the film forming material tank 91, in the $WCl_6$ gas supply line 61; and a flowmeter 97. In the carrier gas line 92, the opening/closing valve 95a is provided directly below the mass flow controller 94 and the opening/closing valve 95b is provided at an insertion end side of the carrier gas line 92. The opening/closing valve 96a, the opening/closing valve 96b, and the flowmeter 97 are disposed in that order from an insertion end of the $WCl_6$ gas supply line 61.

A bypass line 98 connects a portion between the opening/closing valves 95a and 95b of the carrier gas line 92 and a portion between the opening/closing valves 96a and 96b of the $WCl_6$ gas supply line 61. An opening/closing valve 99 is installed in the bypass line 98. By closing the valves 95b and 96a and opening the valves 99, 95a and 96b, $N_2$ gas from the carrier $N_2$ gas supply source 93 can purge the $WCl_6$ gas supply line 61 through the carrier gas line 92 and the bypass line 98.

One end of an evacuation line 101 is connected to a downstream side of the flowmeter 97 in the $WCl_6$ gas supply line 61 and the other end of the evacuation line 101 is connected to the gas exhaust line 41. Opening/closing valves 102 and 103 are provided at portions of the evacuation line 101 which are close to the $WCl_6$ gas supply line 61 and the gas exhaust line 41, respectively. An opening/closing valve 104 is provided at a downstream side of a connecting portion between the evacuation line 101 and the $WCl_6$ gas supply line 61. By closing the opening/closing valves 104, 99, 95a and 95b and opening the opening/closing valves 102, 103, 96a and 96b, the inside of the film forming material tank 91 can be evacuated by the gas exhaust mechanism 42.

The control unit 6 includes a process controller having a microprocessor (computer) for controlling the respective components, e.g., the valves, the power supply source, the heater, the pump and the like, a user interface, and a storage unit. The respective components of the film forming apparatus 100 are electrically connected to and controlled by the process controller. The user interface including a keyboard, a display and the like is connected to the process controller. The keyboard allows an operator to input commands for managing the respective components of the film forming apparatus 100. The display visually displays an operation state of the respective components of the film forming apparatus 100. The storage unit is also connected to the process controller. The storage unit stores control program for executing various processes to be performed in the film forming apparatus 100 under the control of the process controller, a control program, i.e., a processing recipe, for executing predetermined processes of the respective components of the film forming apparatus 100 in accordance with processing conditions, various database, and the like. The processing recipe may be stored in a storage medium (not shown) of the storage unit. The storage medium may be a fixed one such as a hard disk or the like, or a portable one such as a CDROM, a DVD, a semiconductor memory or the like. Also, the processing recipe may be appropriately transmitted from another device through, e.g., dedicated line. If necessary, any processing recipe may be retrieved in the storage unit in accordance with the instruction from the user interface and executed by the process controller, thereby performing a desired process in the film forming apparatus 100 under the control of the process controller.

<Film Forming Method>

The following is description of an embodiment of a method of forming a tungsten film performed by the film forming apparatus 100 configured as described above.

(Outline of Film Forming Method)

First, an outline of the film forming method will be described.

The film forming method of the present embodiment is applied to the case of forming a tungsten film on a wafer in which an underlying film such as a TiN film or the like is formed on a surface of an insulating film having a fine recess.

Figure 2:
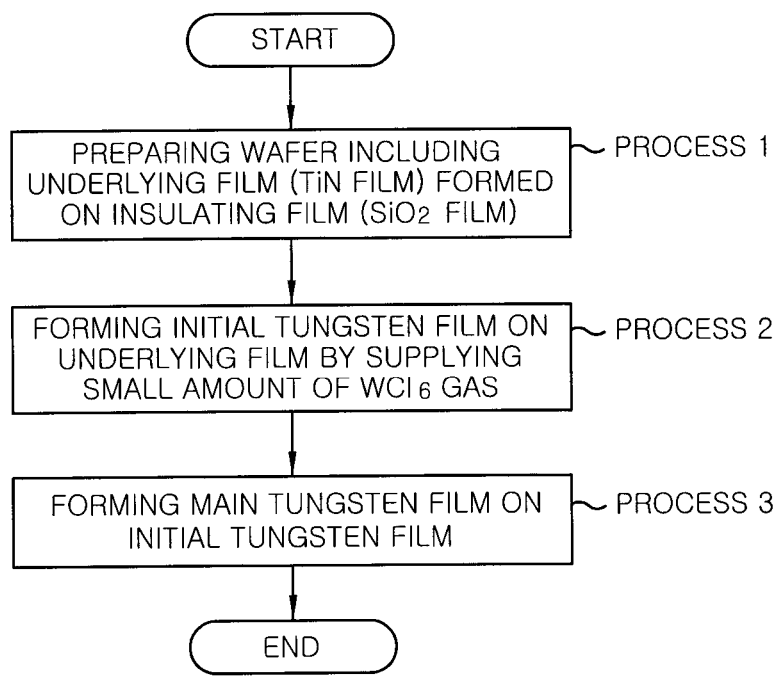
FIG. 2 is a flowchart of the tungsten film forming method according to the embodiment.
Figure 3A:
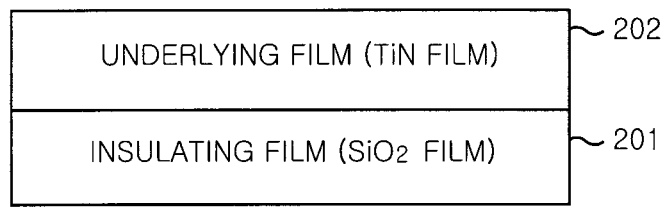
FIGS. 3A to 3C are process cross sectional views showing the tungsten film forming method according to the embodiment.
Figure 3B:
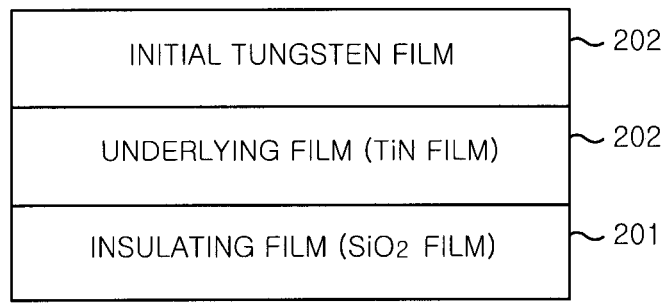

FIG. 2 is a flowchart of the tungsten film forming method of the present embodiment. FIGS. 3A to 3B are process cross sectional views schematically showing the tungsten film forming method of the present embodiment.

First, as shown in FIG. 3A, there is prepared a wafer W in which an underlying film 202 is formed on an insulating film 201 such as a SiO$_2$ film or the like (process 1). Here, the insulating film 201 and the underlying film 202 are illustrated as planar films for convenience. However, actually, a recess having a fine complicated shape is formed in the insulating film 201, and the underlying film 202 is formed along the recess.

The underlying film 202 may be a titanium-based material film such as a TiN film, a TiSiN film, a Ti silicide film, a Ti film, a TiON film, a TiAlN film or the like. Further, the underlying film 202 may be a tungsten-based compound film such as a WN film, a WSix film, a WSiN film or the like. By providing the underlying film 202 on the insulating film 201, the tungsten film having excellent adhesive strength can be formed.

Figure 4:
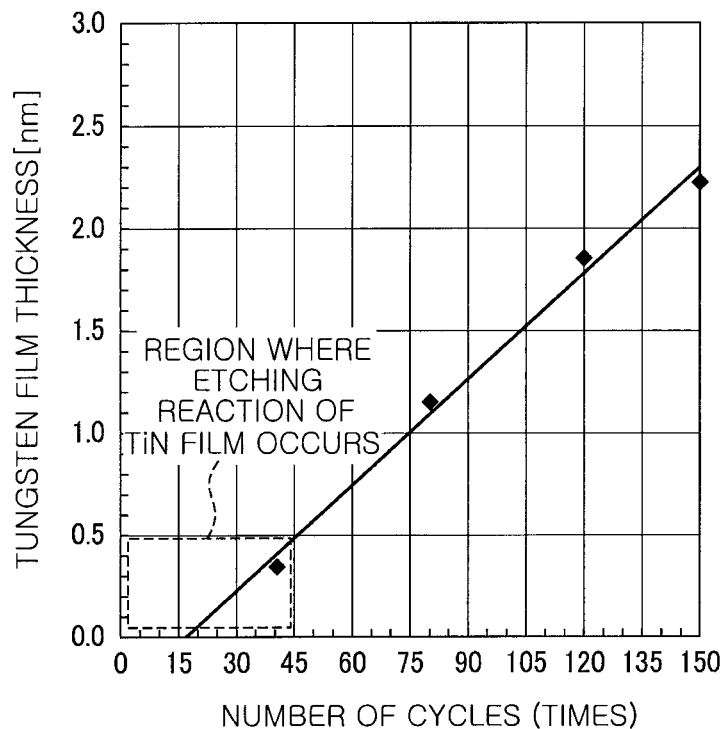
FIG. 4 shows a region where an etching reaction of a TiN film as an underlying film occurs in an initial stage of the tungsten film formation.

In the case of using a TiN film as the underlying film 202 and forming a tungsten film thereon by an ALD method, WCl$_6$ gas as a tungsten chloride gas and H$_2$ gas as a reduction gas are sequentially supplied into the chamber 1 with a purge process interposed therebetween. In that case, as shown in FIG. 4, in an initial stage of forming a film where a tungsten film is hardly formed or a small amount of a tungsten film is formed, WCl$_6$ gas is supplied directly to the TiN film and an etching reaction expressed by the following equation (1) occurs between the TiN film and WCl$_6$ gas.

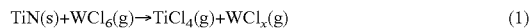

(1)

In the case of using another titanium-based material film or the tungsten compound film as the underlying film 202 as well, the underlying film is etched by WCl$_6$ gas as a tungsten chloride gas.

Figure 5:
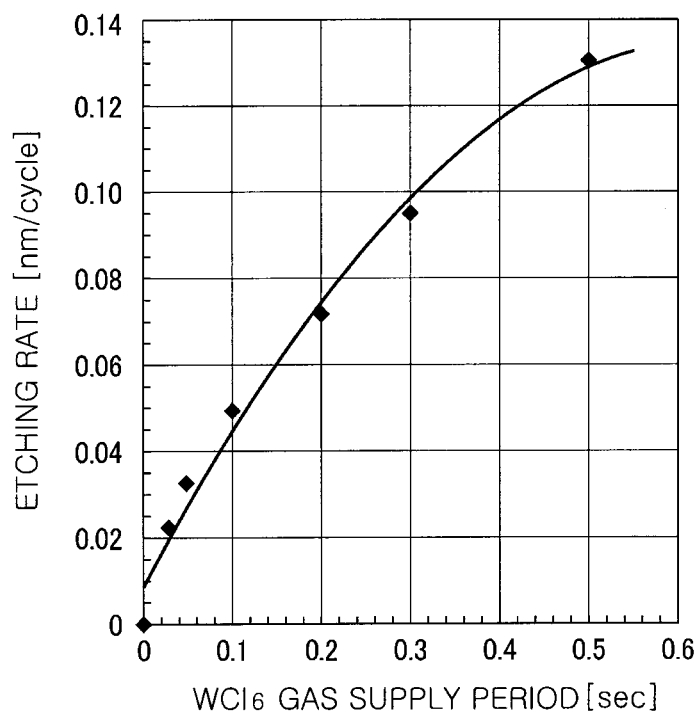
FIG. 5 shows relation between a $WCl_6$ gas supply period and an etching amount of a TiN film per one cycle.
Figure 6:
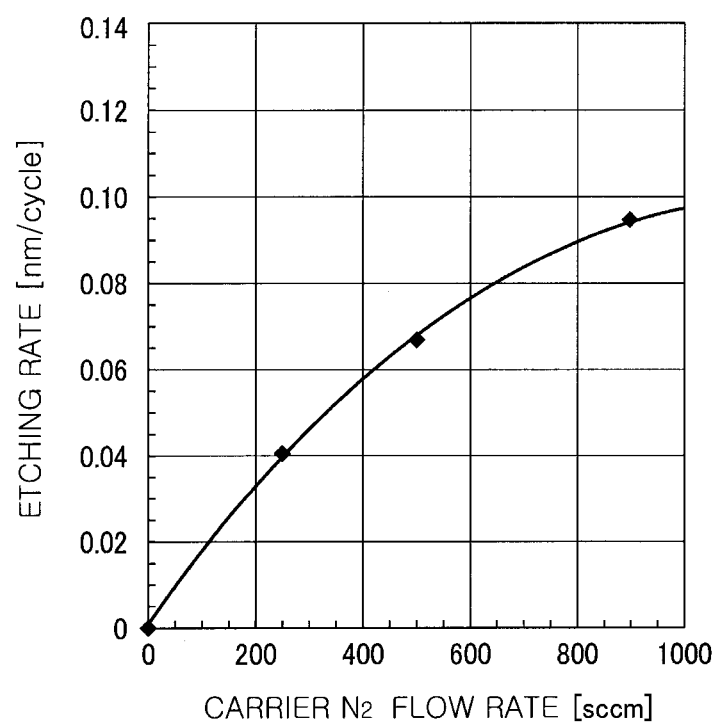
FIG. 6 shows relation between a carrier $N_2$ gas flow rate and an etching amount of a TiN film per one cycle.

FIG. 5 shows relation between a WCl$_6$ gas supply period and an etching amount of a TiN film per one cycle. FIG. 6 shows relation between a carrier N$_2$ gas flow rate and an etching amount of a TiN film per one cycle. Referring to FIGS. 5 and 6, it is clear that the etching amount of the TiN film is increased as the WCl$_6$ supply period and the carrier N$_2$ flow rate are increased. In other words, the etching amount of the TiN film as the underlying film is increased as the supply amount of the tungsten chloride that is a tungsten source is increased.

Therefore, the etching amount of the underlying film 202 tends to be increased as the required amount of the tungsten source gas is increased due to the complication of the recess of the device. Further, along with the miniaturization of the device, the thickness of the underlying film 202 is decreased to 5 nm or less, e.g., about 3 nm, in order to obtain a low resistivity of a wiring. Accordingly, in the case of forming a tungsten film directly on the underlying film 202, due to the miniaturization and the complication of the device, a thickness of the remaining underlying film 202 after etching is smaller than a film thickness (e.g., 1 nm) required to ensure an adhesive strength and fillability of the tungsten film. As a result, the tungsten film has a poor adhesive strength, which deteriorates fillability thereof.

Figure 3C:

Therefore, in the present embodiment, as shown in FIG. 3B, an initial tungsten film 203 is formed on the underlying film 202 while supplying a small amount of WCl$_6$ gas (process 2). Next, as shown in FIG. 3C, a main tungsten film 204 is formed on the initial tungsten film 203 in a state that the amount of the supplied WCl$_6$ gas is increased to a required level (process 3).

In other words, the initial tungsten film 203 is formed by supplying a smaller amount of WCl$_6$ gas for etching the underlying film 202 than that in forming the main tungsten film 204.

Since the supply amount of WCl$_6$ gas in forming the initial tungsten film 203 is small, the amount of the underlying film 202 etched by the initial tungsten film 203 is small. Further, when the main tungsten film 204 is formed by supplying a large amount of WCl$_6$ gas, the initial tungsten film 203 serves as a barrier of the underlying film 202 against WCl$_6$ gas. Therefore, the etching of the underlying film 202 can be suppressed by the initial tungsten film 203.

Figure 7:
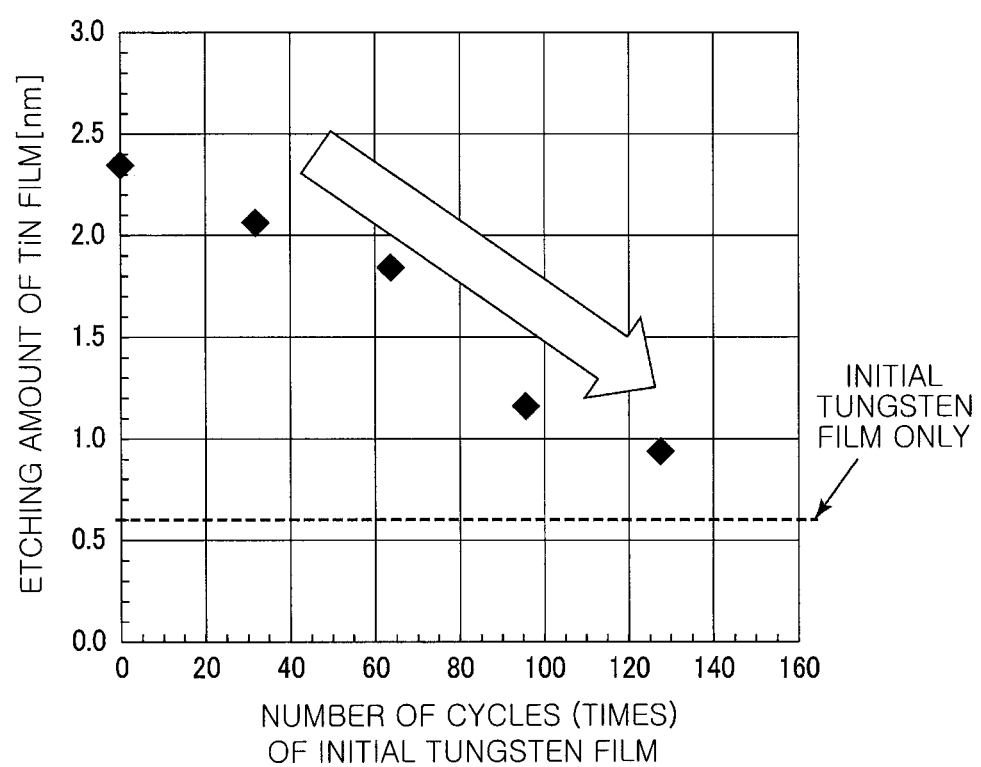
FIG. 7 shows relation between the number of cycles when forming an initial tungsten film and an etching amount of a TiN film when forming a main tungsten film thereon.

This will be described with reference to FIG. 7. FIG. 7 shows relation between the number of cycles when forming an initial tungsten film and an etching amount of a TiN film when forming a main tungsten film thereon. The supply amount of WCl$_6$ gas when forming the initial tungsten film is 3 sccm (partial pressure: 0.02 Torr) and the supply amount of WCl$_6$ gas when forming the main tungsten film is 30 sccm (partial pressure: 1 Torr). Further, a thickness of the TiN film is 3 nm. As shown in FIG. 7, the etching amount of the TiN film is 0.6 nm in a state where the initial tungsten film is formed, whereas the etching amount of the TiN film is 2.35 nm in a state where the initial tungsten film is not formed. From this, it is clear that the etching amount of the TiN film is decreased as the number of cycles of the initial tungsten film formation (i.e., the film thickness of the initial tungsten film) is increased and also that the etching amount of the TiN film can be decreased to 1 nm or less by increasing the number of cycles of the initial tungsten film formation to 120 (the film thickness of about 3 nm) or above.

The step coverage needs to be improved in order to obtain excellent fillability of the main tungsten film 204. Therefore, the film formation needs to be performed by an ALD method or its equivalent sequence by sequentially supplying $WCl_6$ gas and $H_2$ gas into the chamber 1 with a purge process interposed therebetween.

The initial tungsten film 203 can also be formed by sequentially supplying $WCl_6$ gas and $H_2$ gas into the chamber 1 with a purge process interposed therebetween using ALD method or its equivalent sequence in a state where $WCl_6$ gas is supplied at a flow rate smaller than that in forming the main tungsten film 204. Since, however, the initial tungsten film 203 is formed to suppress the etching of the underlying film 202 by the $WCl_6$ gas and does not require the fillability as high as that required in the main tungsten film 204, the initial tungsten film 203 may be formed by simultaneously supplying $WCl_6$ gas and $H_2$ gas into the chamber 1 using a CVD method.

In forming the initial tungsten film 203, it is preferable to supply $WCl_6$ gas at a flow rate enough to sufficiently suppress the etching of the underlying film 202 such as a TiN film or the like. The appropriate range of the flow rate of $WCl_6$ gas is changed by the size of the chamber 1 or the like. Therefore, it is preferable to use a partial pressure of $WCl_6$ gas in the chamber 1 as an index of the flow rate of $WCl_6$ gas. In order to obtain sufficient suppression of the etching of the underlying film 202, the partial pressure of $WCl_6$ gas is preferably 1 Torr (133.3 Pa) or less and more preferably 0.1 Torr (13.33 Pa) or less. Further, when the initial tungsten film 203 is formed, it is preferable to ramp up the flow rate of $WCl_6$ gas from a minimum level to a predetermined level in the initial stage of the film formation. Accordingly, the etching amount of the underlying film 202 by $WCl_6$ gas can be further reduced. In order to ramp up the flow rate of $WCl_6$ gas, the pressure in the film forming material tank or the pressure in the line may be ramped up.

Although the thickness of the initial tungsten film 203 depends on the supply amount (partial pressure) of $WCl_6$ gas when forming the main tungsten film 204, the thickness of the initial tungsten film 203 is preferably 1 nm or above. If the supply amount (partial pressure) of $WCl_6$ gas when forming the main tungsten film 204 is increased, the effect of $WCl_6$ gas on the underlying film 202 is increased. Therefore, the thickness of the initial tungsten film 203 needs to be increased depending on the increase in the supply amount of $WCl_6$ gas in forming the main tungsten film 204.

Figure 8:
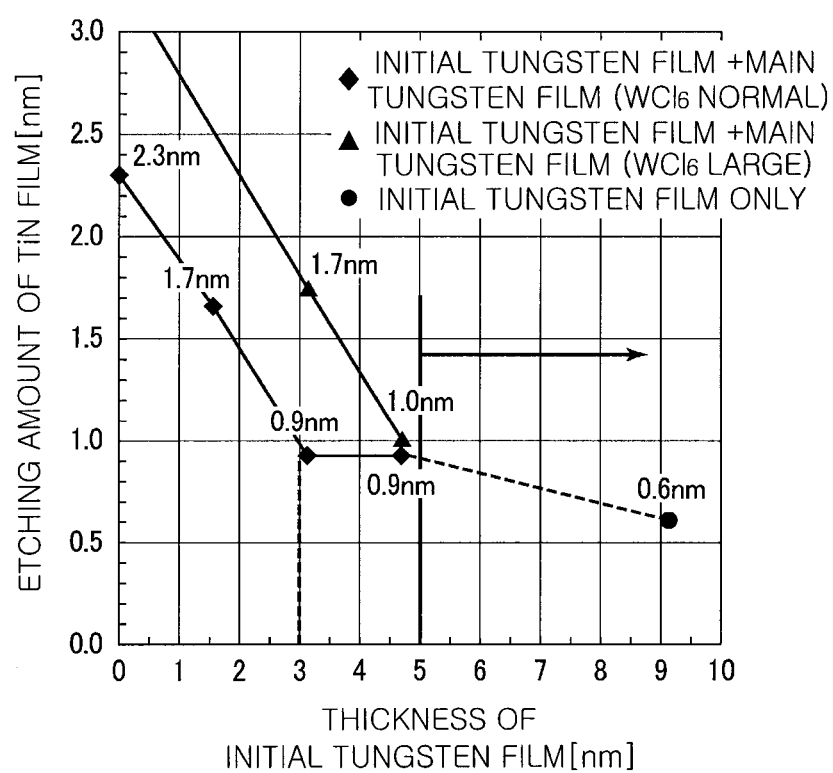
FIG. 8 shows relation between a thickness of an initial tungsten film and an etching amount of a TiN film when forming the initial tungsten film and the main tungsten film by supplying a normal amount of $WCl_6$ gas, when forming the initial tungsten film and the main tungsten film by supplying a large amount of $WCl_6$ gas, and when forming only the initial tungsten film.

This will be described with reference to FIG. 8. FIG. 8 shows relation between a thickness of an initial tungsten film and an etching amount of a TiN film. FIG. 8 shows a case in which the main tungsten film is formed by supplying a normal amount of $WCl_6$ gas after forming the initial tungsten film, a case in which the main tungsten film is formed by supplying a large amount of $WCl_6$ gas after forming the initial tungsten film, and a case of forming only the initial tungsten film. The supply amount of $WCl_6$ gas is 3 sccm (partial pressure: 0.02 Torr) When forming the initial tungsten film. The supply amount of $WCl_6$ gas when forming the main tungsten film is 30 sccm (partial pressure: 1 Torr) in the case of the normal supply amount and 50 sccm (partial pressure: 2 Torr) in the case of the large supply amount. Further, the thickness of the TiN film is 3 nm. From FIG. 8, it has been found that the thickness of the initial tungsten film required to reduce the etching amount of the TiN film to 1 nm or less is 3 nm in the case of the normal supply amount of $WCl_6$ gas and 5 nm in the case of the large supply amount of $WCl_6$ gas. Further, it has been found that the thickness of the initial tungsten film needs to be increased in accordance with the increase in the supply amount of $WCl_6$ gas when forming the main tungsten film.

However, in view of fillability of a metal wiring, the thickness of the initial tungsten film 203 is preferably 10 nm or less.

The initial tungsten film 203 may be formed as a multilayer film by varying the supply amount of $WCl_6$ gas. When the supply amount of $WCl_6$ gas is decreased, the step coverage becomes low and, thus, a film may not be sufficiently formed on some portions of a recess having a complicated shape. In order to as much as possible suppress the attack of $WCl_6$ gas at even these portions when forming the main tungsten film 204, the initial tungsten film 203 may be formed by executing a first step of supplying $WCl_6$ gas at a smallest supply amount and a second step of supplying $WCl_6$ gas at an increased supply amount, or further executing a third step of supplying $WCl_6$ gas at a further increased supply amount.

$WCl_6$ is preferably used as tungsten chloride used for forming the initial tungsten film 203 and the main tungsten film 204. $WCl_5$ and $WCl_4$ that exhibit substantially the same behavior as that of $WCl_6$ may also be used. $WCl_5$ and $WCl_4$ etch the underlying film 202 such as a TiN film or the like as in the case of $WCl_6$, and the initial tungsten film 203 acts effectively against $WCl_5$ and $WCl_4$. In addition, a desirable partial pressure and a desirable thickness of the initial tungsten film 203 in the case of using $WCl_5$ and $WCl_4$ as a tungsten chloride gas are the same as those in the case of using $WCl_6$ as a tungsten chloride gas.

The reduction gas is not limited to $H_2$ gas and may be any reducing gas containing hydrogen. For example, it is possible to use $SiH_4$ gas, $B_2H_6$ gas, $NH_3$ gas or the like instead of $H_2$ gas. Or, two or more gases among $H_2$ gas, $SiH_4$ gas, $B_2H_6$ gas, and $NH_3$ gas may be supplied. In addition, another reduction gas, e.g., $PH_3$ gas, $SiH_2Cl_2$ gas or the like, may be used. In order to obtain a low resistance by further reducing impurities in the film, it is preferable to use $H_2$ gas.

As the purge gas and the carrier gas, an inert gas such as $N_2$ gas, Ar gas or the like may be used.

The wafer temperature in forming the initial tungsten film 203 and the main tungsten film 204 is preferably about 300° C. or above. A pressure in the chamber is preferably 20 Torr to 100 Torr (2666 Pa to 13330 Pa).

<Specific Sequence Executed in the Case of Using Film Forming Apparatus of FIG. 1>

Hereinafter, a specific sequence in the case of using the film forming apparatus of FIG. 1 will be described.

In a state where the susceptor 2 is lowered to the transfer position, the gate valve 12 is opened and the wafer W having the underlying film 202 such as a TiN film on the insulating film 201 as shown in FIG. 3A is loaded into the chamber 1 through the loading/unloading port 11 by the transfer unit (not shown). The wafer W is mounted on the susceptor 2 heated to a predetermined temperature by the heater 21. Then, the susceptor 2 is raised to the processing position. Next, the chamber 1 is evacuated to a predetermined vacuum level, while the opening/closing valves 104, 95a, 95b and 99 are closed and the opening/closing valves 102, 103, 96a and 96b are opened so that the film forming material tank 91 is evacuated through the gas exhaust line 101. Then, the opening/closing valves 76 and 78 are opened and the opening/closing valves 73, 74, 75, 77 and 79 are closed so that the pressure in the chamber 1 is increased and the temperature of the wafer W on the susceptor 2 is stabilized by supplying $N_2$ gas into the chamber 1 from the first and the second $N_2$ gas supply source 54 and 55 through the first and the second continuous supply line 66 and 68.

Next, after the pressure in the chamber 1 reaches a predetermined level, the opening/closing valves 102 and 103 are closed and the opening/closing valves 104, 95a and 95b are opened so that the film forming material tank 91 comes into a state capable of supplying $WCl_6$ gas as a tungsten material as the pressure in the film forming material tank 91 is increased.

In this state, $WCl_6$ gas as a film forming material gas, $H_2$ gas as a reduction gas, and $N_2$ gas a purge gas are sequentially supplied as will be described later, and the initial tungsten film 203 and the main tungsten film 204 are formed consecutively while varying the supply amount (partial pressure) of $WCl_6$ gas as described above.

Figure 9:
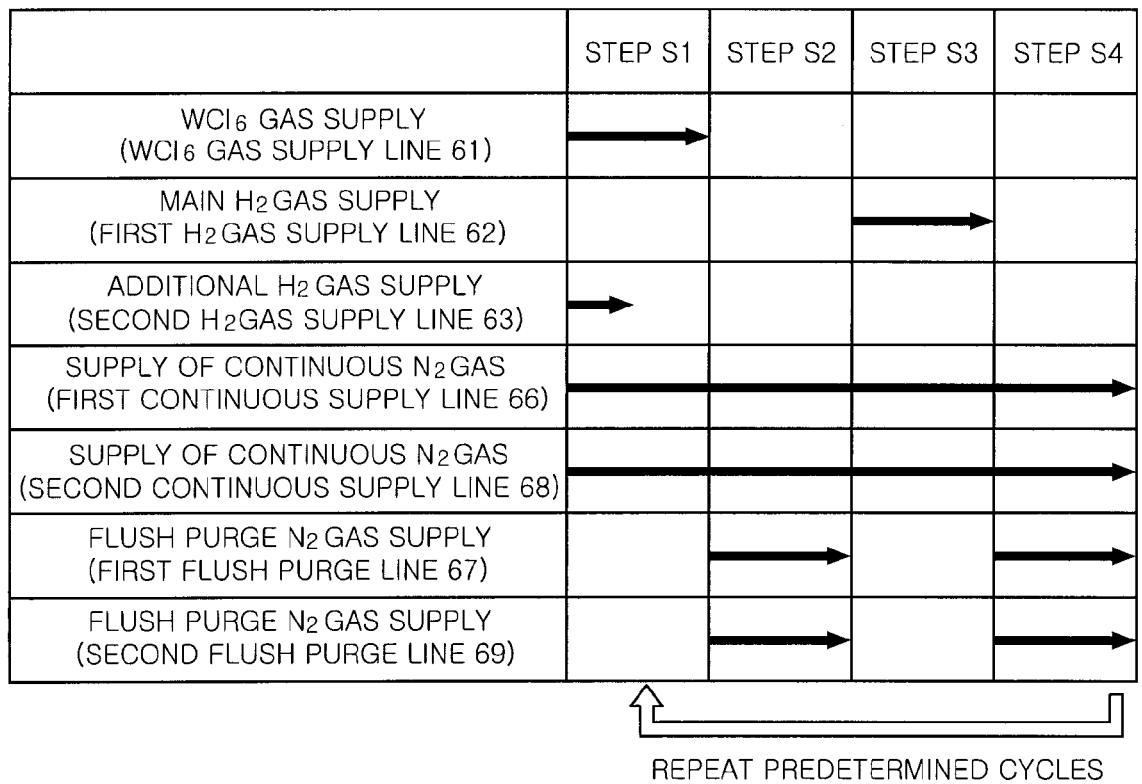
FIG. 9 shows an example of a gas supply sequence when forming an initial tungsten film and a main tungsten film.

FIG. 9 shows an example of a gas supply sequence in forming the initial tungsten film 203 and the main tungsten film 204.

First, in a state where the opening/closing valves 76 and 78 are opened, $N_2$ gas is continuously supplied from the first and the second $N_2$ gas supply source 54 and 55 through the first and the second continuous supply line 66 and 68. Further, by opening the opening/closing valves 73 and 75, $WCl_6$ gas is supplied from the $WCl_6$ gas supply mechanism 51 into the processing space 37 of the chamber 1 through the $WCl_6$ gas supply line 61. At the same time, $H_2$ gas (additional $H_2$ gas) as an additional reduction gas is supplied into the processing space 37 of the chamber 1 through the second $H_2$ gas supply line 63 extended from the second $H_2$ gas supply source 53 (step S1). At this time, $WCl_6$ gas is supplied into the chamber 1 after it is once stored in the buffer tank 80.

By executing the step S1, $WCl_6$ is adsorbed onto the surface of the wafer W. At this time, $WCl_6$ is activated by the added $H_2$.

Next, in a state where the supply of $N_2$ gas through the first and the second continuous supply line 66 and 68 is continued, the supply of $WCl_6$ gas and $H_2$ gas is stopped by closing the opening/closing valves 73 and 75. At the same time, $N_2$ gas (flush purge $N_2$ gas) is supplied through the first and the second flush purge line 67 and 69 by opening the opening/closing valves 77 and 79, so that a residual $WCl_6$ gas or the like in the processing space 37 is purged by a large flow rate of $N_2$ gas (step S2).

Next, the supply of $N_2$ gas through the first and the second flush purge line 67 and 69 is stopped by closing the opening/closing valves 77 and 79. In a state where the supply of $N_2$ gas through the first and the second continuous supply line 66 and 68 is continued, $H_2$ gas (main $H_2$ gas) as the main reduction gas is supplied into the processing space 37 from the first $H_2$ gas supply source 52 through the first $H_2$ gas supply line 62 by opening the opening/closing valve 74 (step S3). At this time, $H_2$ gas is supplied into the chamber 1 after it is once stored in the buffer tank 81.

By executing the step S3, $WCl_6$ adsorbed onto the wafer W is reduced. The flow rate of the main $H_2$ gas at this time is enough to allow the reduction reaction to occur and is larger than that of the additional $H_2$ gas in the step S1.

Next, in a state where the supply of $N_2$ gas through the first and the second continuous supply line 66 and 68 is continued, the supply of $H_2$ gas through the first $H_2$ gas supply line 62 is stopped by closing the opening/closing valve 74. At the same time, $N_2$ gas (flush purge $N_2$ gas) is also supplied from the first and the second flush purge line 67 and 69 by opening the opening/closing valves 77 and 79. Accordingly, as in the step S2, a residual $H_2$ gas in the processing space 37 is purged by a large flow rate of $N_2$ gas (step S4).

By executing one cycle of the steps S1 to S4 within a short period of time, a thin tungsten unit film is formed. By repeating such a cycle multiple times, the initial tungsten film 203 and the main tungsten film 204 having desired film thicknesses are formed. The thicknesses of the initial tungsten film 203 and the main tungsten film 204 can be controlled by the repetition number of the cycle.

As $WCl_6$ gas is activated in the step S1 by supplying the additional reduction gas from the second $H_2$ gas supply line 63 simultaneously with the $WCl_6$ gas, film forming reaction in the step S3 can easily occur. Accordingly, a deposited film thickness per one cycle can be increased and a film forming rate can be increased while maintaining a high step coverage. At this time, $H_2$ gas needs to be supplied at a flow rate that is enough to maintain the ALD reaction by suppressing the CVD reaction and preferably, the flow rate of $H_2$ gas is 100 sccm (mL/min) to 500 sccm (mL/min). As shown in FIG. 10, the additional $H_2$ gas from the second $H_2$ gas supply line 63 may be continuously supplied during the steps S2 to S4. By doing so, when $WCl_6$ gas is supplied, the additional $H_2$ gas as an additional reduction gas is also supplied and, thus, $WCl_6$ gas can be activated. At this time, in view of maintaining the ALD reaction by suppressing the CVD reaction, the flow rate of the $H_2$ gas is preferably 10 sccm (mL/min) to 500 sccm (mL/min). However, when the film formation reaction occurs satisfactorily without the additional $H_2$ gas, the additional $H_2$ gas may not be supplied.

In the sequence described above, in a state where $N_2$ gas as a purge gas is continuously supplied through the first and the second continuous supply line 66 and 68 to the $WCl_6$ gas supply line 61 and the first $H_2$ gas supply line 62 in the steps S1 to S4, $WCl_6$ gas and $H_2$ gas are intermittently supplied in the steps S1 and S3. Therefore, the gas replacement efficiency in the processing space 37 can be improved. Further, $N_2$ gas is added through the first and the second flush purge line 67 and 69 during the process of purging the processing space 37 in the steps S2 and S4. Thus, the gas replacement efficiency in the processing space can be further improved. Accordingly, the controllability of the thickness of the tungsten unit film can be improved.

In the film forming apparatus shown in FIG. 1, the $WCl_6$ gas supply line 61 and the first $H_2$ gas supply line 62 have the buffer tanks 80 and 81, respectively. As a result, $WCl_6$ gas and $H_2$ gas can be easily supplied within a short period of time. Therefore, even when one cycle is short, the required amount of $WCl_6$ gas and $H_2$ gas in the steps S1 and S3 can be easily supplied.

Figure 11:
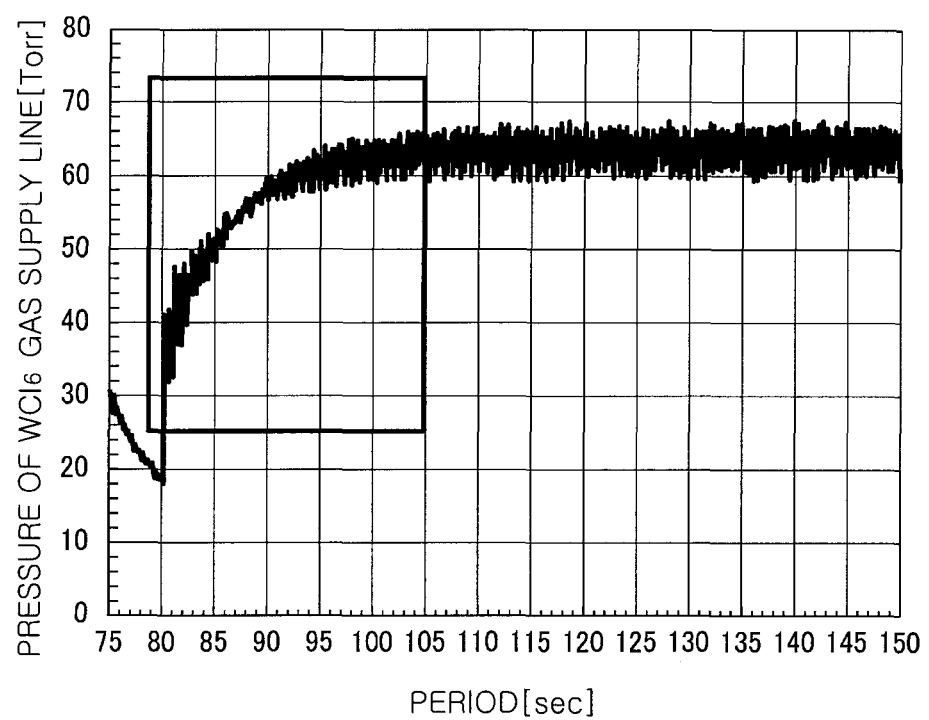
FIG. 11 shows a pressure value of a pressure gauge provided in $WCl_6$ gas supply line in the case of ramping up an amount of the supplied $WCl_6$ gas during the initial tungsten film formation.

When forming the initial tungsten film 203, in order to further reduce the amount of the underlying film 202 etched by $WCl_6$ gas, it is preferable to ramp up the flow rate of $WCl_6$ gas from a minimum level to a predetermined level in step S1 in the initial stage of the film formation as described above. At this time, the pressure in the film forming tank 91 and the pressure the $WCl_6$ gas supply line 61 are ramped up by gradually increasing the flow rate of $N_2$ gas as a carrier gas supplied to the film forming material tank 91. FIG. 11 shows a pressure value of the pressure gauge 97 installed in the $WCl_6$ gas supply line 61. As shown in FIG. 11, the value of the pressure gauge 97 is gradually increased in the initial stage of the formation of the initial tungsten film 203 and reaches a set value in about 100 seconds.

As described above, the initial tungsten film 203 does not require the fillability as high as that required in the main tungsten film 204. Therefore, the initial tungsten film 203 may be formed by a CVD method. In that case, the supply of $WCl_6$ gas from the $WCl_6$ gas supply line 61 and the supply of $H_2$ gas from the first $H_2$ gas supply line 62 may be simultaneously performed.

Film Forming Condition

Hereinafter, desired film forming condition of the initial tungsten film 203 and the main tungsten film 204 will be described.

(1) Initial tungsten film 203 i) ALD

Pressure: 20 Torr to 100 Torr (2666 Pa to 13330 Pa)

Temperature: 300° C. or above (more preferably 450° C. to 600° C.)

$WCl_6$ gas flow rate: 0.1 sccm (mL/min) to 10 sccm (mL/min)

(Carrier gas flow rate: 1 sccm (mL/min) to 1000 sccm (mL/min))

$WCl_6$ gas partial pressure (described above): 1 Torr (133.3 Pa) or less (more preferably 0.1 Torr (13.33 Pa) or less)

Main $H_2$ gas flow rate: 10 to 5000 sccm (mL/min)

Continuously supplied $N_2$ gas flow rate: 10 sccm (mL/min) to 10000 sccm (mL/min)

(First and second continuous supply lines 66 and 68)

Flush purge $N_2$ gas flow rate: 100 sccm (mL/min) to 100000 sccm (mL/min)

(First and second flush purge lines 67 and 69)

Duration of step S1 (per once): 0.01 sec to 5 sec

Duration of step S3 (per once): 0.1 sec to 5 sec

Duration of steps S2 and S4 (purge) (per once): 0.1 sec to 5 sec

Additional $H_2$ gas supply period in step S1 (per once): 0.01 sec to 0.3 sec

Heating temperature of film forming material tank: 130° C. to 190° C.

ii) CVD

Pressure: 20 Torr to 100 Torr (2666 Pa to 13330 Pa)

Temperature: 300° C. or above (preferably 450° C. to 600° C.)

$WCl_6$ gas flow rate: 0.1 sccm (mL/min) to 10 sccm (mL/min)

(Carrier gas flow rate: 1 sccm (mL/min) to 1000 sccm (mL/min))

$WCl_6$ gas partial pressure (described above): 1 Torr (133.3 Pa) or less (preferably 0.1 Torr (13.33 Pa) or less)

Main $H_2$ gas flow rate: 10 to 5000 sccm (mL/min)

$N_2$ gas flow rate: 10 sccm (mL/min) to 10000 sccm (mL/min)

(2) Main tungsten film 204

Pressure: 5 Torr to 50 Torr (666.5 Pa to 6665 Pa)

Temperature: 300° C. or above (preferably 450° C. to 600° C.)

$WCl_6$ gas flow rate: 3 sccm (mL/min) to 60 sccm (mL/min)

(Carrier gas flow rate: 100 sccm (mL/min) to 2000 sccm (mL/min))

$WCl_6$ gas partial pressure: 0.5 Torr to 10 Torr (66.7 Pa to 1333 Pa)

Main $H_2$ gas flow rate: 2000 sccm (mL/min) to 8000 sccm (mL/min)

Additional $H_2$ gas flow rate (described above): 100 sccm (mL/min) to 500 sccm (mL/min)

Continuously supplied $N_2$ gas flow rate: 100 sccm (mL/min) to 500 sccm (mL/min)

(First and second continuous supply lines 66 and 68)

Flush purge $N_2$ gas flow rate: 500 sccm (mL/min) to 3000 sccm (mL/min)

(First and second flush purge lines 67 and 69)

Duration of step S1 (per once): 0.01 sec to 5 sec

Duration of step S3 (per once): 0.1 sec to 5 sec

Duration of steps S2 and S4 (purge) (per once): 0.1 sec to 5 sec

Additional $H_2$ gas supply period in step S1 (per once): 0.01 sec to 0.3 sec

Heating temperature of film forming material tank: 130° C. to 170° C.

Effect of Embodiment

In the present embodiment, when the tungsten film is formed on the wafer W having the underlying film 202, the initial tungsten film 203 is formed before the main tungsten film 203. The main tungsten film is formed by an ALD method or its equivalent method by using a tungsten chloride gas represented by $WCl_6$ gas and a reduction gas represented by $H_2$ gas. The initial tungsten film 203 is formed using an ALD method or a CVD method by supplying the tungsten chloride gas at a flow rate smaller than a flow rate of the tungsten chloride gas supplied for forming the main tungsten film. Since the flow rate of the tungsten chloride gas supplied for forming the initial tungsten film 203 is small, the amount of the underlying film 202 etched during the formation of the initial tungsten film 203 is small. Further, the initial tungsten film 203 serves as a barrier of the underlying film 202 against $WCl_6$ gas when the main tungsten film 204 is formed by supplying tungsten chloride gas at a large flow rate. Therefore, the etching of the underlying film 202 can be suppressed by the initial tungsten film 203. Accordingly, although the underlying film 202 becomes thinner in order to obtain a low resistance of the wiring in accordance with the miniaturization of the device or the supply amount of the tungsten chloride gas is increased due to the complication of the device, the required amount of the underlying film 202 can remain and the tungsten film having an excellent adhesive strength and excellent fillability can be formed.

<Other Application>

While the embodiments have been described, the present invention may be variously modified without being limited to the above-described embodiments. For example, in the above-described embodiments, the semiconductor wafer is described as an example of the substrate. However, the semiconductor wafer may be a silicon substrate or a compound semiconductor such as GaAs, SiC, GaN or the like. Further, the disclosure may be applied to a glass substrate used for a FPD (Flat Panel Display) such as a liquid crystal display or the like, a ceramic substrate, or the like, without being limited to the semiconductor wafer.

While the disclosure has been shown and described with respect to the embodiments, it will be understood by those skilled in the art that various changes and modifications may be made without departing from the scope of the disclosure as defined in the following claims.

What is claimed is:

1. A method of forming a tungsten film on a substrate having thereon an underlying film by using a tungsten chloride gas as a tungsten source gas and a reduction gas for reducing the tungsten chloride gas, the substrate being accommodated in a chamber maintained under a depressurized atmosphere, the method comprising:

forming an initial tungsten film on the underlying film, by sequentially supplying the tungsten chloride gas and the reduction gas into the chamber while supplying a purging gas into the chamber between supply of the tungsten chloride gas and supply of the reduction gas, or by simultaneously supplying the tungsten chloride gas and the reduction gas into the chamber, and forming a main tungsten film on the initial tungsten film by sequentially supplying the tungsten chloride gas and the reduction gas into the chamber while purging an inside of the chamber between supply of the tungsten chloride gas and supply of the reduction gas, wherein a supply amount of the tungsten chloride gas supplied in the forming the initial film is smaller than a supply amount of the tungsten chloride gas supplied in the forming the main tungsten film.

2. The method of claim 1, wherein in the forming the initial tungsten film, the tungsten chloride gas is supplied to cause a partial pressure of the tungsten chloride gas in the chamber to be 1 Torr or less.

3. The method of claim 2, wherein the partial pressure of the tungsten chloride gas is 0.1 Torr or less.

4. The method of claim 1, wherein in the forming the initial tungsten film, the supply amount of the tungsten chloride gas is ramped up to a set value.

5. The method of claim 1, wherein a thickness of the initial tungsten film is 1 nm or more.

6. The method of claim 5, wherein the thickness of the initial tungsten film is changed depending on the supply amount of the tungsten chloride gas supplied in the forming the main tungsten film.

7. The method of claim 1, wherein the initial tungsten film comprises two or more layers which are formed by varying the supply amount of the tungsten chloride gas in the forming the initial film.

8. The method of claim 1, wherein in the forming the initial tungsten film and in the forming the main tungsten film, a temperature of the substrate is 300° C. or higher and a pressure in the chamber is 5 Torr or higher.

9. The method of claim 1, wherein the tungsten chloride gas is one of $WCl_6$, $WCl_5$ and $WCl_4$.

10. The method of claim 1, wherein the reduction gas is one or more gases selected from a group consisting of $H_2$ gas, $SiH_4$ gas, $B_2H_6$ gas, and $NH_3$ gas.

11. The method of claim 1, wherein a thickness of the underlying film is 5 nm or less.

12. The method of claim 1, wherein the underlying film comprises a titanium-based material film or a tungsten compound film.

13. A computer-readable non-transitory storage medium storing a program for controlling a film forming apparatus, wherein the program, when executed, causes a computer to control the film forming apparatus to perform the method of forming a tungsten film, wherein the method comprises:

forming an initial tungsten film on an underlying film, by sequentially supplying a tungsten chloride gas and a reduction gas into a chamber of the film forming apparatus while supplying a purging gas into the chamber between supply of the tungsten chloride gas and supply of the reduction gas, or by simultaneously supplying the tungsten chloride gas and the reduction gas into the chamber, and forming a main tungsten film on the initial tungsten film by sequentially supplying the tungsten chloride gas and the reduction gas into the chamber while purging an inside of the chamber between supply of the tungsten chloride gas and supply of the reduction gas, wherein a supply amount of the tungsten chloride gas supplied in the forming the initial film is smaller than a supply amount of the tungsten chloride gas supplied in the forming the main tungsten film.

\* \* \* \* \*